US005844250A

United States Patent [19]

Itoh et al.

[11] Patent Number: 5,844,250

[45] Date of Patent: Dec. 1, 1998

[54] FIELD EMISSION ELEMENT WITH SINGLE CRYSTALLINE OR PREFERRED ORIENTED POLYCRYSTALLINE EMITTER OR INSULATING LAYER

[75] Inventors: Shigeo Itoh; Isao Yamada, both of Mobara, Japan

[73] Assignee: Futaba Denshi Kogyo K.K,, Mobara, Japan

[21] Appl. No.: 483,853

[22] Filed: Jun. 7, 1995

Related U.S. Application Data

[62] Division of Ser. No. 194,465, Feb. 8, 1994, Pat. No. 5,584, 739.

[30] Foreign Application Priority Data

Feb. 10, 1993 [JP] Japan .................................... 5-044331
Feb. 10, 1993 [JP] Japan .................................... 5-044332

[51] Int. Cl.$^{6}$ .............................. H01L 29/12; H01J 1/14; H01J 1/48; H01J 9/12

[52] U.S. Cl. ............................ 257/10; 257/623; 257/628; 313/311; 313/355; 313/336; 313/309; 445/49; 445/51

[58] Field of Search .................................. 257/9, 10, 11, 257/623, 628; 445/49, 50, 51; 313/306, 307, 308, 309, 310, 311, 336, 351, 352, 355

[56] References Cited

U.S. PATENT DOCUMENTS

| | | | |
|---|---|---|---|
| 4,983,878 | 1/1991 | Lee et al. | 313/308 |
| 5,038,070 | 8/1991 | Bardai et al. | 313/309 |
| 5,064,396 | 11/1991 | Spindt | 313/309 |
| 5,249,340 | 10/1993 | Kane et al. | 445/50 |
| 5,391,956 | 2/1995 | Watanabe | 313/309 |
| 5,448,132 | 9/1995 | Komatsu | 313/309 |
| 5,448,133 | 9/1995 | Ise | 313/308 |
| 5,451,175 | 9/1995 | Smith et al. | 445/51 |
| 5,468,169 | 11/1995 | Kane et al. | 445/50 |
| 5,469,014 | 11/1995 | Itoh et al. | 313/308 |
| 5,589,738 | 12/1996 | Onodaka et al. | 315/169.1 |
| 5,650,689 | 7/1997 | Itoh et al. | 313/310 |

FOREIGN PATENT DOCUMENTS

| | | | |
|---|---|---|---|
| 3-238729 | 10/1991 | Japan | 445/50 |
| 4-6728 | 1/1992 | Japan | 313/311 |
| 4-106834 | 4/1992 | Japan | 445/51 |
| 4-138636 | 5/1992 | Japan | 313/311 |
| 5-182583 | 7/1993 | Japan | 445/50 |

*Primary Examiner*—Carl W. Whitehead
*Assistant Examiner*—Alice W. Tang
*Attorney, Agent, or Firm*—Oblon, Spivak, McClelland, Maier & Neustadt, P.C.

[57] ABSTRACT

A process for manufacturing a field emission element including a substrate, and an emitter and a gate each arranged on the substrate is provided. The emitter is formed at at least a tip portion thereof with an electron discharge section, which is formed of metal or semiconductor into a monocrystalline structure or a polycrystalline structure preferentially oriented in at least a direction perpendicular to the substrate by deposition.

5 Claims, 18 Drawing Sheets

[illegible]

Cross sectional view of ICB-Al(111)/Si(111) interface.

(3 degrees off substrate)

[1010] incident beam

FIELD EMISSION ELEMENT WITH SINGLE CRYSTALLINE OR PREFERRED ORIENTED POLYCRYSTALLINE EMITTER OR INSULATING LAYER

This is a Division of application Ser. No. 08/194,465 filed on Feb. 8 1994, now U.S. Pat. No. 5,584,739.

BACKGROUND OF THE INVENTION

This invention relates to a field emission element and a process for manufacturing the same, and more particularly to a field emission element which is used as an electron source for a variety of electron beam application devices such as a luminous-type display device, a write head for a printer, an electron microscope, an electron beam exposure device, an electron gun for a CRT, a micro wave amplifier tube and the like and decreased in manufacturing cost and a process for manufacturing the same.

When an electric field applied to a surface of a metal material or a semiconductor material is set to be about 10° (V/m), a tunnel effect permits electrons to pass through a barrier, resulting in the electrons being discharged to a vacuum even at a normal temperature. This is referred to as "field emission" and a cathode constructed so as to emit electrons based on such a principle is referred to as "field emission cathode" (hereinafter also referred to as "FEC").

Recently, semiconductor processing techniques permit a field emission cathode of the surface discharge type to be formed of field emission cathode elements as small as microns. The field emission cathode thus formed tends to be used for a fluorescent display device, a CRT, an electron microscope and an electron beam apparatus.

A conventional field emission element typically includes a so-called Spindt-type cathode widely known in the art, which was published as a microchip display by Standard Research Institute (SRI) and Laboratoire d'Electroniqu de Technologie et de l'Instrumentation (LETI) in France. The Spindt-type cathode is formed in such a manner that a gate electrode is formed on a thermal oxidation film or an insulating film provided on a metal film electrode for an emitter formed on a glass substrate and the metal gate film and insulating film each are formed with an opening. Then, the opening is formed therein with an emitter of a conical shape for electron field emission using self-alignment techniques of depositing metal such as Mo or the like acting as a mask by electron beam deposition .

FIG. 17 shows a device having a so-called Spindt-type field emission cathode (hereinafter also referred to as "FEC") incorporated therein which includes a resistor between an emitter and a cathode element.

More particularly, the device shown in FIG. 17 includes cathode lines 101 formed on a substrate 100. The cathode lines 101 each are formed thereon through a resistive layer 102 with emitters 115 of a conical shape according to a method described hereinafter. Also, the cathode lines 101 each are provided thereon with a gate electrode layer or gate line 104 through an insulating layer 103. The gate electrode layer 104 is formed with round openings, in which the emitters 115 are arranged. The emitters 115 each are so arranged that a tip portion thereof is exposed from the opening of the gate electrode layer 104.

Arrangement of the resistive layer between each of the emitters 115 and each of the cathode elements of the cathode, even when dust or an electric field causes short-circuiting to occur between the emitter and the gate which are arranged in close proximity to each other during manufacturing or operation of the device, effectively eliminates a disadvantage that a large current flowing through the emitter due to the short-circuiting causes fusion of the emitter to lead to scattering of the emitter toward any cathode elements arranged in proximity thereto, resulting in deteriorating a function of the field emission cathode.

Now, an example of manufacturing of such a Spindt-type FEC as described above will be described hereinafter with reference to FIGS. 18(*a*) to 18(*f*).

First, as shown in FIG. 18(*a*), the cathode line 101 is formed on the substrate 100 made of glass or the like by vapor deposition and then the resistive layer 102 is formed on the cathode line 101 by sputtering deposition. Thereafter, the insulating layer 103 which is made of silicon oxide is formed on the resistive layer 102.

Then, the insulating layer 103 is provided thereon with the gate electrode layer 104 made of niobium (Nb) by vapor deposition, on which a photoresist is then deposited, followed by forming the gate electrode layer 104 with an opening 113 by patterning and etching as shown in FIG. 18(*b*), resulting in a laminate being provided.

The laminate thus formed may be subject to wet etching using BHF or the like or reactive ion etching (RIE) by means of $CHF_6$, so that the insulating layer 103 is subject to isotropic etching, resulting in being formed with a hole 114 in which the emitter 115 is formed, as shown in FIG. 18(*c*).

Then, as shown in FIG. 18(*c*), aluminum is deposited in an oblique direction on the substrate 100 while rotating the substrate 100, leading to formation of a release layer 105. Such oblique deposition permits the release layer 105 to be selectively deposited only on a surface of the gate electrode layer 104 other than in the hole 114 of the insulating layer 103.

Subsequently, as shown in FIG. 18(*d*), a material layer 106 made of a molybdenum (Mo) mixture or the like is vertically downwardly deposited with respect to the substrate 100 from above the release layer 105 by electron beam deposition. This causes the material layer 106 to enter the hole 144 of the insulating layer 103 as well, so that the material layer 106 may be deposited in the form of a conical shape on the resistive layer 102, leading to formation of the emitter 115.

Thereafter, the release layer 105 and material layer 106 formed on the gate electrode layer 104 are removed by etching, resulting in such an FEC as shown in FIG. 18(*e*) being formed. The FEC shown in FIG. 18(*e*) permits a distance between the conical emitter 115 and the gate electrode layer 104 to be reduced to a level as small as submicrons, so that application of a voltage as small as tens volts between the emitter 115 and the gate 104 permits the emitter 115 to emit electrons.

Also, as shown in FIG. 18(*f*), a second insulating layer 107 and a second gate electrode layer 108 may be laminated in turn on the gate electrode layer 104, followed by formation of the FEC as described above. This results in the FEC being constructed into a triode structure in which the second gate electrode layer 108 acts as a focusing electrode.

The step of forming the field emission element described above and shown in FIG. 18(*d*) typically uses an electron beam deposition apparatus for deposition of the emitter.

Now, an electron beam deposition apparatus conventionally used for this purpose will be described with reference to FIG. 19. The electron beam deposition apparatus includes a vacuum vessel in which a crucible H is arranged for melting a material to be deposited (hereinafter referred to as "deposited material"). The crucible H has a deposited material M for forming an emitter placed therein.

Reference character F designates a filament for emitting electron beams therefrom. Electron beams EB emitted from the filament is deflected as indicated by arrows in FIG. 19 by means of a deflection coil (not shown) and then impinged on the deposited material M while being accelerated by an acceleration electrode P.

Such impingement of the electron beams on the material M causes it to be heated to a degree sufficient to be melted, to thereby be vaporized or evaporated. This results in the material M being deposited on the laminate as shown in FIG. 18(*d*), leading to formation of the conical emitter 115.

In general, the electron beam deposition causes a composition of the material and purity thereof to be subject to restriction. Also, the electron beam deposition is to uniformly heat the deposited material M to convert it into a vapor while scanning electron beams, therefore, it requires to use a crucible formed with an opening of an increased diameter.

However, formation of the tip portion of the conical emitter into a pointed shape requires that the deposition material or metal has a high melting point. Unfortunately, melting of the metal having a high melting point for the deposition causes the crucible to be likewise heated to a high temperature, so that it is highly difficult to carry out the deposition while ensuring high purity or quality of a film formed by the deposition. Also, use of such a crucible formed with an opening of an increased diameter as described above causes the material M vaporized or evaporated to extensively diffuse as indicated at dotted lines in FIG. 19, to thereby act as a spot evaporation source, resulting in the amount of vaporized molecules of the material which are vertically incident on the laminate on which the FEC is to be formed being decreased. This prevents the emitter from being uniformly formed into a conical shape.

Unfortunately, this leads to a problem that the emitter 115, as shown in FIG. 20, is formed into a shape wherein a peripheral portion of the emitter is inclined at a tip portion thereof on the basis of a central portion of the laminate.

In order to solve the problem, an approach would be considered that the evaporation source and laminate are positioned separate from each other to move the laminate while rotating it, to thereby permit the evaporated material to be substantially vertically incident on the laminate. However, in such an apparatus as shown in FIG. 19, an increase in distance L between the evaporation source and the laminate causes mechanical requirements for evacuating the apparatus to a vacuum to be excessively increased and deteriorates throughput for depositing the material for the emitter on the laminate, resulting in an extensive loss of the deposited material of a high cost.

In view of the above, employment of a sputtering process for formation of the emitter has been attempted. However, the sputtering process is to essentially utilize sputter of neutrons and/or molecules occurring when accelerated ions are impinged on a solid material, therefore, it causes an angle at which particles sputtered due to impingement or collision between gas molecules and a sputter material are incident on the laminate to be increased, leading to a decrease in the number of particles passing through the gate opening of a small size.

For this reason, the sputtering process often causes the gate opening to be clogged before the emitter is formed into a conical shape, to thereby substantially fail to uniformly form the emitter of a conical shape of which the tip portion is pointed or sharpened.

Also, cutting of the sputter particles having a high energy level or an decrease in pressure of the gas molecules using deposition by the sputtering process causes the throughput to be highly decreased to deteriorate yields of the material, leading to an increase in manufacturing cost.

Further, in the field emission element described above, the emitter is generally formed of a polycrystal, to thereby cause a disadvantage that adsorption and release of the gas occurring at grain boundaries of the crystal during operation of the field emission element render discharge of electrons therefrom unstable and/or concentration of an electric field on the emitter causes breakage of the emitter. An approach to the problem is proposed in Japanese Patent Application Laid-Open Publication No. 86427/1979 which is directed to a method for manufacturing a field emission element including an emitter of a monocrystalline structure. The method disclosed is constructed so as to arrange a seed monocrystal on a bottom of a recess formed on a substrate and form an emitter including a pointed tip end while acting the seed as a core.

Unfortunately, it was found that the method using the seed monocrystal as a core to grow the monocrystalline emitter has many disadvantages.

One of the disadvantages is that the method fails to form the emitter with satisfactory reproducibility and uniformity. Another disadvantage is that it is highly difficult to accurately set a positional relationship between the tip portion of the emitter and the gate with good reproducibility because a shape of the emitter is varied depending on growth of the crystal. A further disadvantage of the method is that a combination of the insulating material and the seed crystal is subject to substantial restriction. Still another disadvantage is that it is highly difficult to sharpen or point the tip portion of the emitter. Yet another disadvantage is that the material for the emitter is subject to restriction. The method has a still further disadvantage of being complicated in process.

Further, in the conventional field emission element, it is required to form the insulating layer on the substrate. In view of the requirement, a layer of $SiO_2$ is formed on a surface of a Si substrate. For this purpose, formation of $SiO_2$ is generally carried out by thermal oxidation of Si, CVD or the like.

However, formation of $SiO_2$ by thermal oxidation, CVD or the like causes the insulating layer formed to have an amorphous structure or a highly fine polycrystalline structure approximating the amorphous structure, resulting in causing disadvantages.

One of the disadvantages is that the insulating layer is deteriorated in uniformity of dielectric strength over an increased area of the insulating layer to cause a variation in characteristics of the field emission element, leading to a distribution of a current density of the element and a deterioration of the current density due to breakage of the emitters which starts from the emitters of good characteristics.

Another disadvantage is that the conventional insulating layer made of a highly fine polycrystal approximating an amorphous structure is readily varied in insulating characteristics with time due to discharge of occluded gas from the grain boundaries and/or damage to the field emission emitter by electron impact, resulting in deterioration in field emission characteristics of the element readily occurring.

A further disadvantage is that the conventional insulating layer having a highly fine polycrystalline structure approaching an amorphous structure tends to be deteriorated in insulating characteristics by a temperature encountered during manufacturing of a device having the field emission element mounted thereon.

Still another disadvantage is encountered when the insulating layer is applied to a high-speed device. More particularly, in the high-speed device, capacitance between the emitter and the gate constitutes an important factor. In order to further promote a decrease in capacitance, there is made an attempt to construct the field emission element into a finer structure. However, the attempt causes deterioration in insulating strength of the insulating layer. Unfortunately, the conventional insulating layer fails to exhibit insulating strength sufficient to realize the attempt.

SUMMARY OF THE INVENTION

The present invention has been made in view of the foregoing disadvantages of the prior art.

Therefore, it is an object of the present invention to provide a field emission element which is capable of permitting a monocrystalline emitter exhibiting satisfactory reproducibility and uniformity to be formed.

It is another object of the present invention to provide a field emission element which is capable of exhibiting increased characteristics.

It is a further object of the present invention to provide a field emission element which has increased insulating strength and uniformity.

It is still another object of the present invention to provide a process for manufacturing a field emission element which is capable of providing a field emission element accomplishing the above-described objects.

In accordance with one aspect of the present invention, a process for manufacturing a field emission element including a substrate, and an emitter and a gate each arranged on the substrate is provided. The process comprises the step of forming at least a tip portion of the emitter with an electron emitting section, wherein the electron emission section is formed of metal or semiconductor into a monocrystalline structure or a polycrystalline structure preferentially oriented in at least a direction perpendicular to the substrate by deposition.

In a preferred embodiment of the present invention, the electron emission section is made of a material selected from the group consisting of Au, Ag, Al, Be, Co, Cu, Cr, Fe, Ga, Ge, In, Ir, La, Li, Mg, Mn, Mo, Ni, Nb, Pd, Pt, Sb, Si, Th, Ti, Zr and Zn, and carbides, oxides, nitrides and other inorganic compounds each containing at least one of the metals.

In a preferred embodiment of the present invention, the electron emission section is formed by ICB deposition or MBE deposition.

In accordance with another aspect of the present invention, a field emission element is provided. The field emission element comprises a substrate, and an emitter and a gate each arranged on the substrate, wherein the emitter is formed of metal or semiconductor into a monocrystalline structure of which a whole bottom is arranged in a specified crystal orientation with respect to the substrate.

Also, in accordance with this aspect of the present invention, a field emission element is also provided. The field emission element comprises a substrate, and an emitter and a gate each arranged on the substrate, wherein the emitter is formed of a polycrystal preferentially oriented with respect to the substrate.

Further, in accordance with this aspect of the present invention, a field emission element is provided. The field emission element comprises a substrate, and an emitter and a gate each arranged on the substrate, wherein the emitter includes a bottom arranged contiguous to the substrate and a tip portion which are made of materials different from each other and the tip portion is formed of metal or semiconductor into a monocrystalline structure or a polycrystalline structure preferentially oriented in at least a direction perpendicular to the substrate.

In addition, in accordance with the present invention, a process for manufacturing a field emission element including a substrate, and a cathode electrode layer, an insulating layer and a gate electrode each formed on the substrate, wherein the insulating layer is subject at a predetermined portion thereof to etching, resulting in being formed with an opening in which an emitter is formed. The process comprises a first step of forming metal of a low-melting point by ICB deposition and a second step of forming another metal on the metal of a low-melting point deposited in the first step by electron beam deposition or sputtering, to thereby form the emitter with at least a tip portion, whereby the emitter is formed.

In a preferred embodiment of the present invention, a material to be deposited by the ICB deposition is placed in a crucible provided with a plurality of nozzles or a plurality of crucibles.

In a preferred embodiment of the present invention, the metal of a low-melting point is selected from the group consisting of Cr, Cu, Fe, Mg, Mn, Ni, Sn, Zn, Al and compounds thereof and the metal of which the tip portion of the emitter is formed is selected from the group consisting of Nb, Mo, Pd, Pt, Ti, Au, C, La, Re, Rh, Ru, Ta, Tc, Th, U, V, W, Zr and compounds thereof.

Furthermore, in accordance with the present invention, a field emission element is provided. The field emission element comprises a substrate, and a cathode electrode layer, an insulating layer and a gate electrode layer each formed on the substrate, wherein the insulating layer is formed at a predetermined portion thereof with an opening by etching, in which an emitter is formed, the emitter is formed at a part thereof of metal suitable for deposition by ICB, and the emitter is covered at at least a tip portion thereof with metal of a high-melting point.

Moreover, in accordance with the present invention, a field emission element is provided. The field emission element comprises a substrate, and a gate and an emitter insulated through an insulating layer which are arranged on the substrate, wherein the insulating layer is formed into a monocrystalline structure or a polycrystalline structure preferentially oriented in at least a direction perpendicular to the substrate.

In a preferred embodiment of the present invention, the insulating layer is made of a material selected from the group consisting of oxides of Al, Ti, Be, Ca, Th, Mg, Zn and Zr and compounds of at least one of the metals.

Also, in accordance with the present invention, a process for manufacturing a field emission element including a substrate, and a gate and an emitter insulated through an insulating layer which are formed on the substrate is provided. The process comprises the step of forming the insulating layer into a monocrystalline structure or a polycrystalline structure preferentially oriented in at least a direction perpendicular to the substrate by deposition.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, a present invention will be described hereinafter with reference to the accompanying drawings.

Figure 1A:
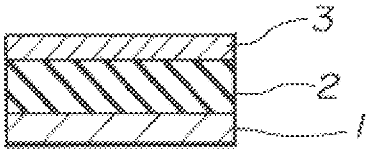
FIGS. 1(*a*) to 1(*f*) each are a schematic view showing each of steps executed in an embodiment of the present invention.
Figure 1B:
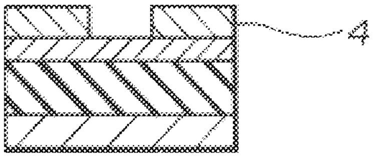
Figure 1C:
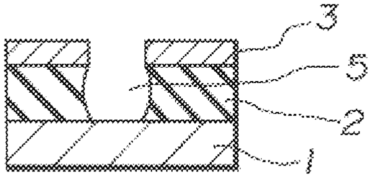
Figure 1D:
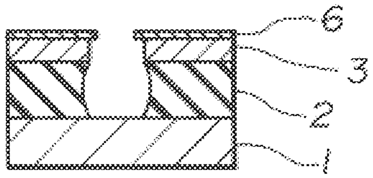
Figure 1E:
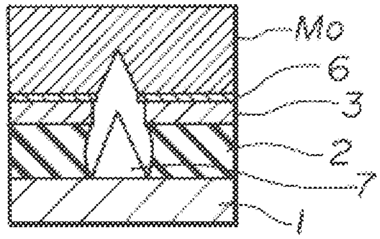
Figure 1F:
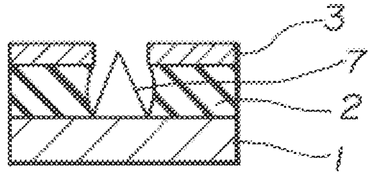
Figure 2:
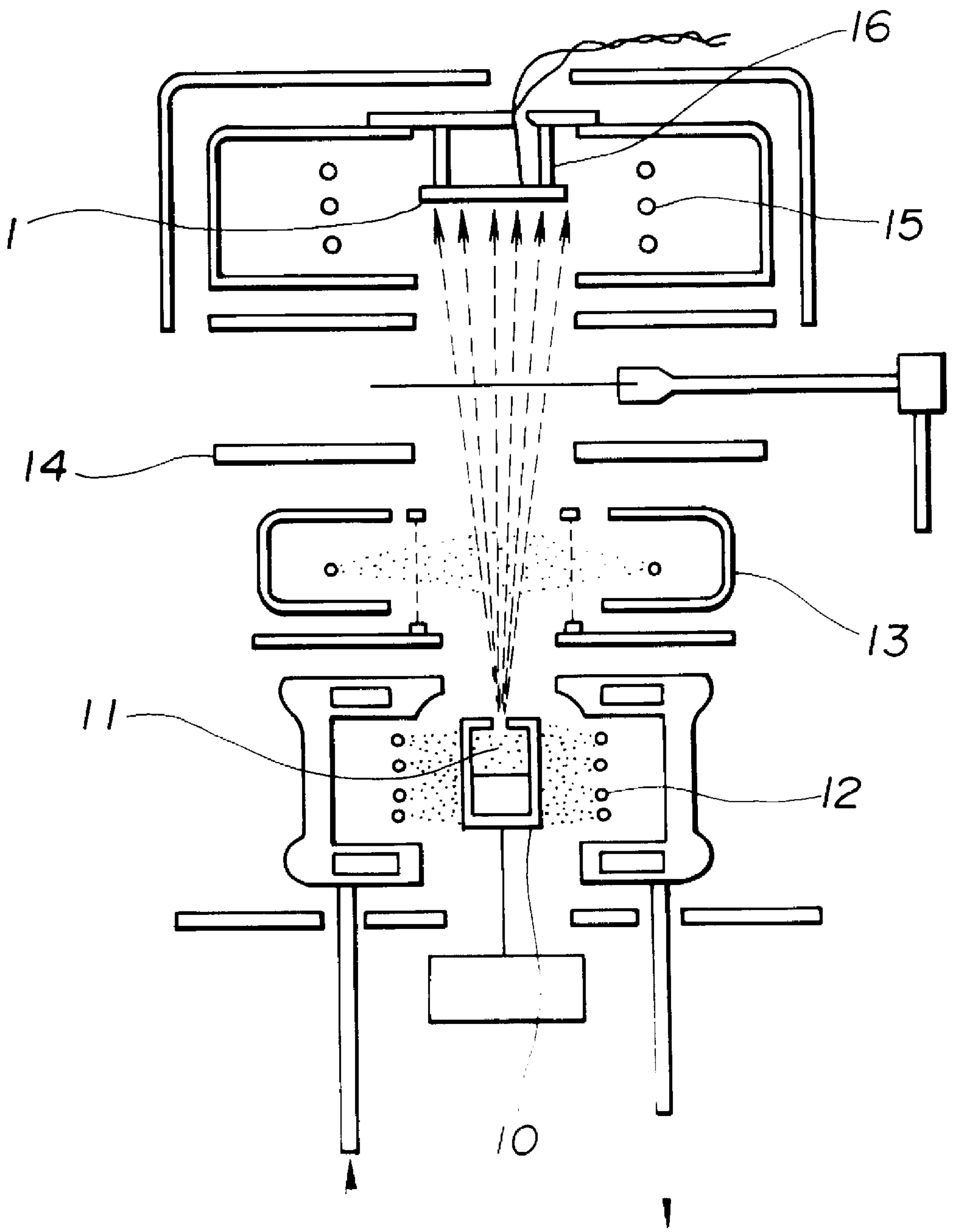
FIG. 2 is a schematic view showing an example of an ICB deposition apparatus suitable for use in an embodiment of the present invention.
Figure 3:
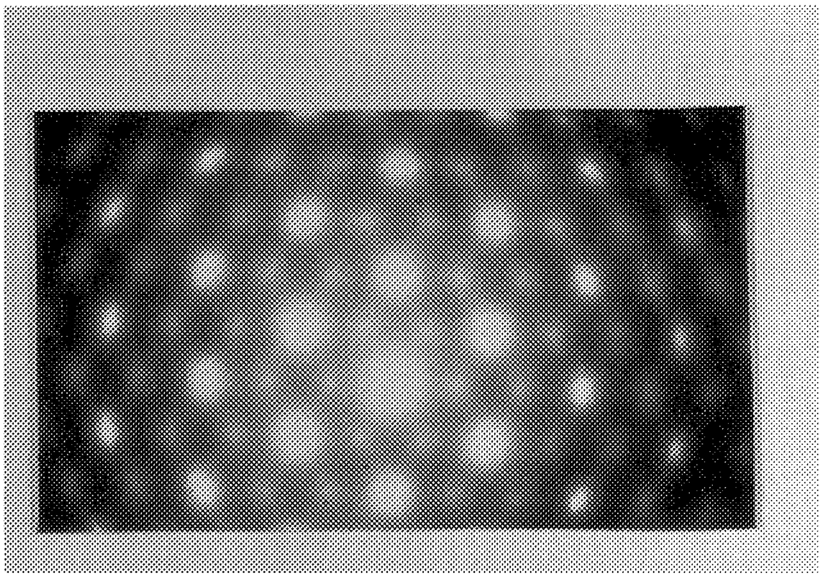
FIG. 3 is an electron beam diffraction showing a RHEED pattern of an Au epitaxial growth film on a Ge substrate obtained in an embodiment of the present invention.

Referring first to FIGS. 1 to 3, an embodiment of the present invention is illustrated which is directed to a process for forming a Spindt-type field emission element on a Si substrate and a field emission element prepared according to the process.

FIGS. 1(*a*) to 1(*f*) show steps executed for manufacturing of a Spindt-type field emission element. First, as shown in FIG. 1(*a*), $SiO_2$ acting as an insulating layer 2 is formed on a Si substrate 1 by thermal oxidation of Si, sputtering deposition thereof, vacuum deposition thereof or the like and then a gate layer 3 made of a Nb film is deposited on the insulating layer 2. Then, as shown in FIG. 1(*b*), a diameter of each of holes of the gate layer 3 is patterned by a resist 4, and then the Nb film or gate layer 3 is subject to reactive ion etching (RIE). Subsequently, as shown in FIG. 1(*c*), the insulating layer 2 is subject to etching by means of buffer hydrofluoric acid or the like, to thereby form gate holes 5. Thereafter, deposition of an Al release layer 6 is carried out in an oblique direction on the gate layer 3 while preventing the layer 6 from being formed in each of the gate holes 5 as shown in FIG. 1(*d*), followed by formation of an emitter 7 of a conical shape on the substrate 1 through the hole 5 by vertically depositing an emitter material such as Au, Mo or the like on the substrate 1 by ICB deposition or MBE deposition as shown in FIG. 1(*e*). Finally, the Al release 6 layer is removed as shown in FIG. 1(*f*).

Now, a description will be made on formation of a Ge layer on a Si substrate using Au as an example of a material for an emitter, followed by formation of an emitter on the Ge layer or formation of an emitter on a Ge substrate.

FIG. 2 schematically shows an ICB deposition apparatus (hereinafter also referred to as "ICB apparatus") suitable for use in the emitter formation step shown in FIG. 1(*e*). In the ICB apparatus, a material for an emitter is placed in an ICB crucible 10 made of carbon and provided at an upper end thereof with a nozzle 11. The crucible 10 is heated by a heating unit 12. The emitter material vaporized and discharged from the nozzle 11 is partially ionized due to collision with accelerated electrons in an ionization section 13, resulting in forming clusters. The thus-formed clusters are accelerated by an acceleration electrode 14, to thereby be permitted to reach a holding section 16 kept at a predetermined temperature by a heater 15.

In the ICB apparatus constructed as described above, Au (4N) of high purity is charged in the ICB crucible 10 made of carbon. During deposition, an ionization current and an ionization voltage are set to be 100 mA and 200 V and an acceleration voltage is set at a value of 0 to 5 kV. When a Si substrate is used, a Si oxide film is removed from a surface of the substrate by subjecting it to chemical etching and then heating it at 880° C. for 20 minutes in an ultra-high-vacuum atmosphere prior to deposition. Then, a Ge epitaxial layer is formed into a thickness of about 700 A on the Si substrate by means of the ICB apparatus, on which an Au epitaxial layer is then formed. When a Ge substrate is used, it is subject to polishing using a fine $Al_2O_3$ powder as a polishing material and then subject to etching using CP-4 solution (HF, $HNO_3$, $CH_3COOH$, Br), resulting in a destructive layer on a surface of the substrate being removed therefrom. The substrate is set at a room temperature when it is made of Si and a temperature of 300° to 500° C. when it is made of Ge. Also, a degree of vacuum in the apparatus is set at $5\times10^{-9}$ Torr or less.

FIG. 3 is an electron beam diffraction showing a RHEED pattern of an Au epitaxial growth film of Au/Ge (111)/Si (100) thus formed. The RHEED pattern indicates that Au on the substrate is monocrystalline.

A combination of the emitter material and substrate which is applicable to the embodiment of the present invention also includes Al/Si, Cu/Si, Au/Si, Al/Ge, Cu/Ge, Au/Ge and the like.

Figure 4:
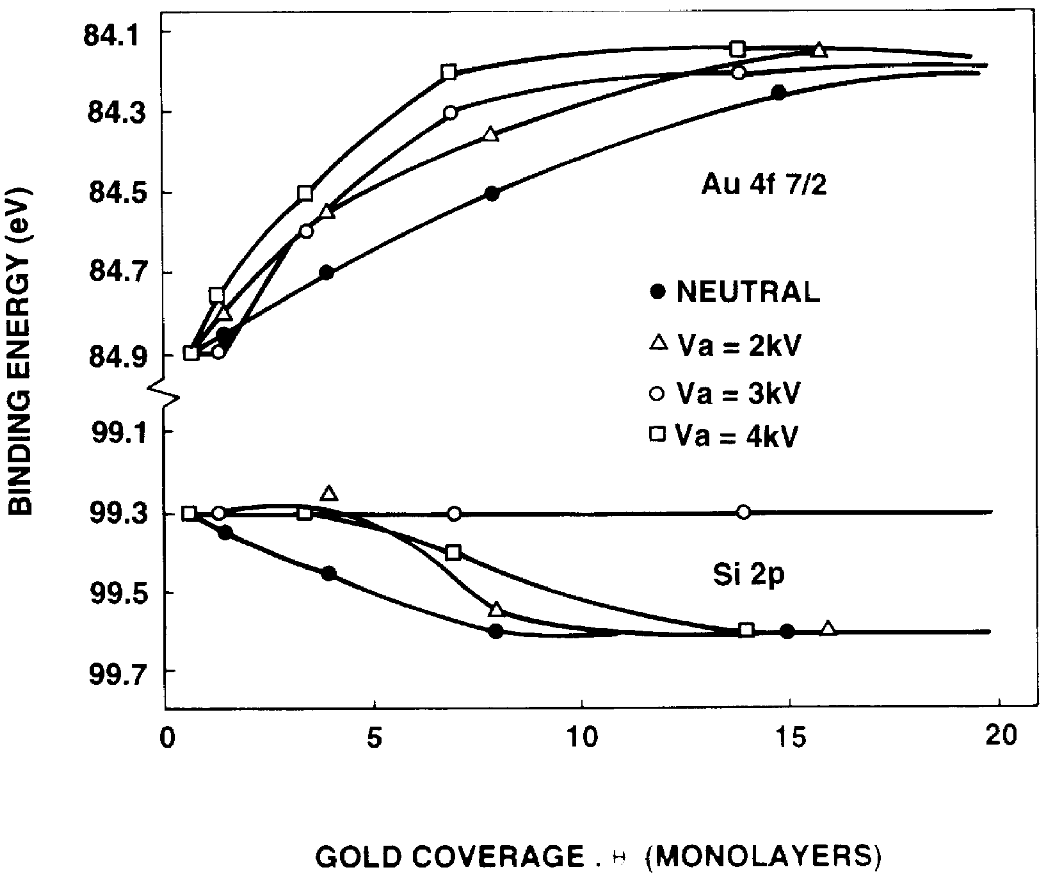
FIG. 4 is a graphical representation of an ESCA analysis showing relationships of a bonding ion acceleration voltage of an Auger electron.
Figure 5A:
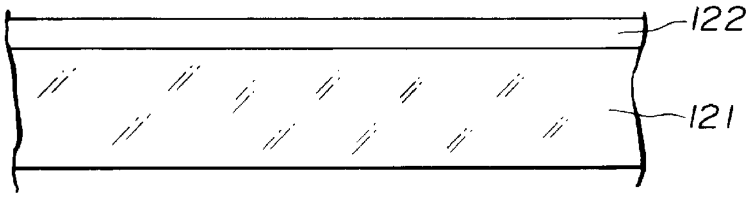
FIGS. 5(*a*) to 5(*d*) each are a schematic view showing each of steps executed in another embodiment of a process for manufacturing a field emission element according to the present invention.
Figure 5B:
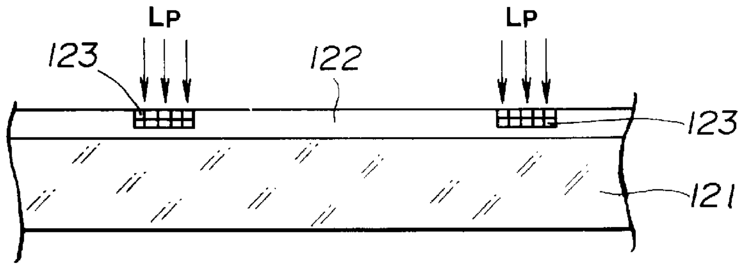
Figure 5C:
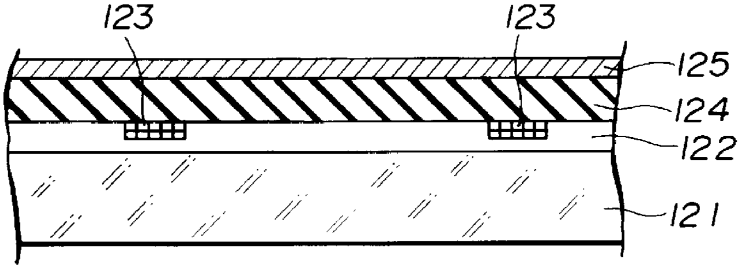
Figure 5D:
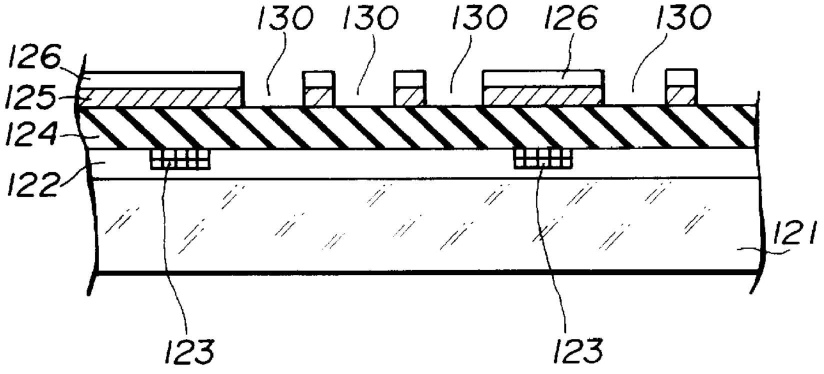

In the illustrated embodiment of the present invention, the ion acceleration voltage essentially affects quality of the film. FIG. 4 shows a variation in ion acceleration voltage at a peak position of bonding energy of $Au_{4f7/2}$ and $Si_{2p}$ during formation of the film, which is obtained by ESCA analysis. FIG. 4 indicates that application of the ion acceleration voltage following the ionization permits the bonding energy to approach a bulk value at a reduced thickness of the film as compared with the case that the ionization is not carried out. In FIG. 4, the ion acceleration voltage of 3 kV permits a stable metal film to be obtained at a minimum thickness of the film. This indicates that ICB deposition is advantageous in formation of a stable epitaxial film on a semiconductor substrate.

Formation of the field emission element in such a manner as described above permits the emitter to be formed of a monocrystal or a polycrystal preferentially oriented in a direction perpendicular to the substrate. It is a tip portion of the emitter that emits electrons, so that formation of a base portion of the emitter which is arranged so as to be contiguous to or contacted with the substrate by any conventional method such as sputtering deposition, vacuum deposition or the like, followed by formation of the tip portion by ICB deposition, MBE deposition or the like permits the tip portion of the emitter to be formed of a monocrystal or a polycrystal preferentially oriented in a direction perpendicular to the substrate.

The fact that the tip portion and base portion of the emitter are formed of materials different from each other permits a material which is hard to be conformable to the substrate to be used for forming the tip portion of the emitter as desired.

The above description of the illustrated embodiment is directed to the Spindt-type field emission element and the process for manufacturing the same, however, it may be applied to preparation of an emitter for a flat-type field emission element.

As can be seen from the foregoing, the illustrated embodiment is so constructed that the emitter is formed by ICB deposition or MBE deposition. Such construction permits a configuration of the emitter to be rendered uniform and the opening of the gate electrode and the tip portion of the emitter to be positionally aligned with each other. Also, in the illustrated embodiment, the emitter is formed into a monocrystalline structure or a polycrystalline structure which is preferentially oriented in the direction perpendicular to the substrate. Further, the ICB deposition facilitates controlling of crystal orientation of the emitter. Thus, the emitter may be constructed into a crystalline structure optimum to emission of electrons therefrom.

Referring now to FIGS. 5 to 8, another embodiment of the present invention is illustrated.

FIGS. 5(*a*) to 5(*d*) show steps executed for manufacturing of a field emission cathode of the illustrated embodiment. More particularly, first of all, an amorphous silicon layer 122 doped with phosphor or boron is formed on one surface of a glass substrate 121 by plasma CVD or the like. The dope material includes in addition to phosphor and boron, gallium (Ga), indium (In), Thallium (Ta) and the like, each of which permits the amorphous silicon layer 122 to be an n-type or a p-type when it is incorporated therein.

In connection with gas species, $PH_4$ is incorporated in an amount of several to tens percent in $SiH_4$ or $Si_2H_6$, followed by plasma decomposition, so that the amorphous silicon layer 122 of $10^2$ to $10^8$ Ω/cm in resistivity is formed as shown in FIG. 5(*a*), which acts as a resistive layer 122.

Then, as shown in FIG. 5(*b*), the amorphous layer 122 is irradiated with, for example, excimer laser (wavelength: 308 nm) to carry out an annealing treatment for instantaneously heating predetermined regions of the layer 122, resulting in the regions of the amorphous silicon layer 122 irradiated with laser being converted from an amorphous structure into a monocrystalline structure. This causes phosphor or boron doped in the layer 122 to be activated, so that the regions 123 annealed may be changed to a conductor of $10^{-1}$ to $10^{-4}$ Ω/cm in resistivity.

The regions 123 each are adapted to act as a cathode element. Alternatively, it may be formed by deposition of Al which has been conventionally carried out in the art.

Figure 6A:
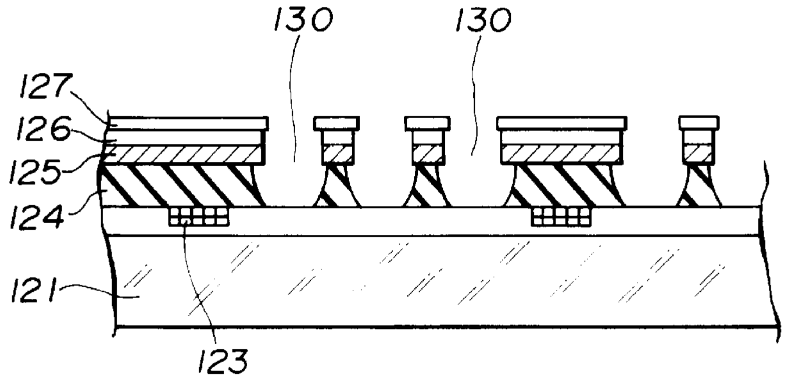
FIGS. 6(*a*) to 6(*c*) each are a schematic view showing latter steps further executed in the embodiment of FIGS. 5(*a*) to 5(*d*)
Figure 6B:
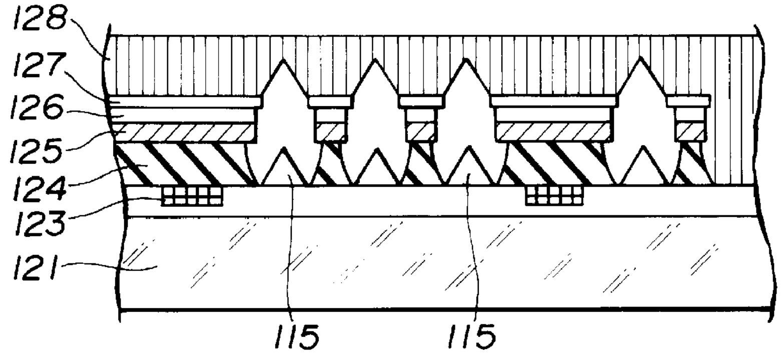
Figure 6C:
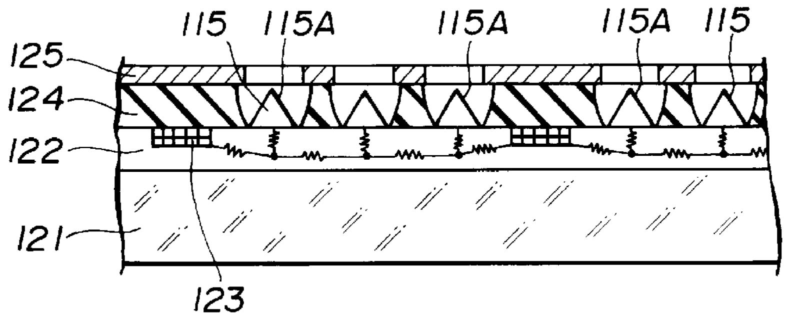

The amorphous silicon layer 122 thus formed on the glass substrate is formed thereon with an insulating layer 124 and a gate electrode layer 125 in turn as shown in FIG. 5(*c*) and then formation of an FEC is carried out as shown in FIG. 5(*d*) and FIG. 6(*a*) to 6(*c*). More particularly, the gate electrode layer 125 is covered at each of predetermined portions thereof with a mask, to thereby form a photoresist layer 126. Then, etching is carried out to form the gate electrode layer 125 with holes 130 as shown in FIG. 5(*d*), followed by deposition of Al in an oblique direction to form a release layer 127 on the photoresist layer 126 as shown in FIG. 6(*a*). Then, the insulating layer 124 is formed with holes 130 through openings of the release layer 127 by isotropic etching as shown in FIG. 6(*a*).

Figure 7:
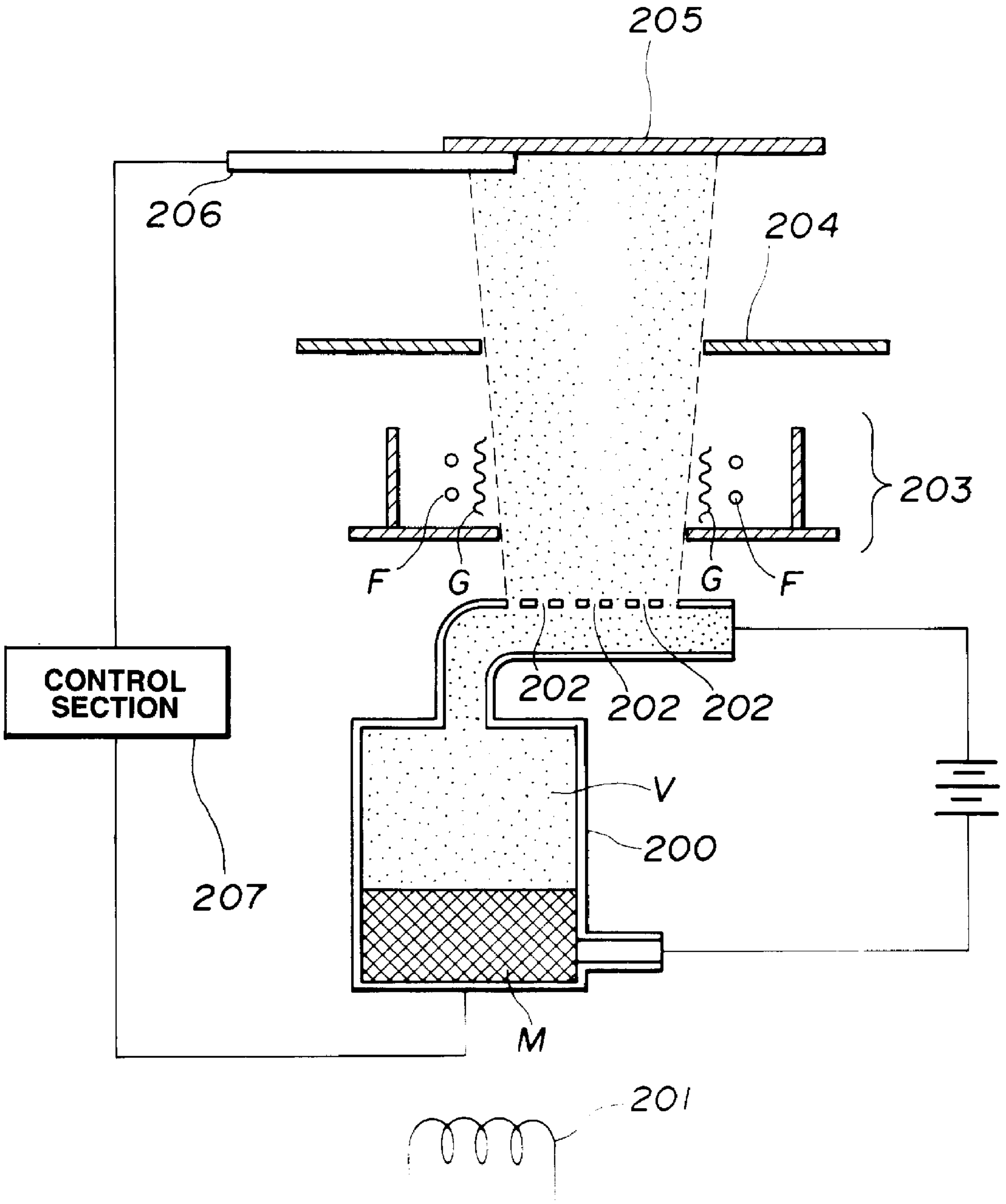
FIG. 7 is a schematic view showing a principle of an electron beam deposition apparatus.

Then, metal of a low-melting point such as chromium (Cr) for the emitter is formed on the amorphous silicon 122 through each of the holes 130 by ICB deposition described hereinafter. An ICB deposition apparatus used for this purpose may be constructed as shown in FIG. 7. More particularly, metal of a relatively low-melting point such as Cr is placed as a deposited material or a material to be deposited M in a crucible 200. The crucible 200 is electrically connected to a power supply for direct heating, resulting in being heated. Also, it is subject to auxiliary heating by filament 201. The crucible 200 is provided at an upper portion thereof with a plurality of nozzles 202, through which vapor V of the deposited material M evaporated in the crucible due to heating is discharged into a vacuum vessel.

The deposited material discharge into the vacuum vessel is ionized in an ionization unit space 203 in which a filament and a grid for ionization are arranged and then accelerated in an acceleration unit space 20, resulting in being impinged on a laminated substrate 205. Reference numeral 206 designates a detector for detecting a speed of deposition of the material on the substrate 205 and 207 is a control section for controlling the deposition speed.

Figure 8:
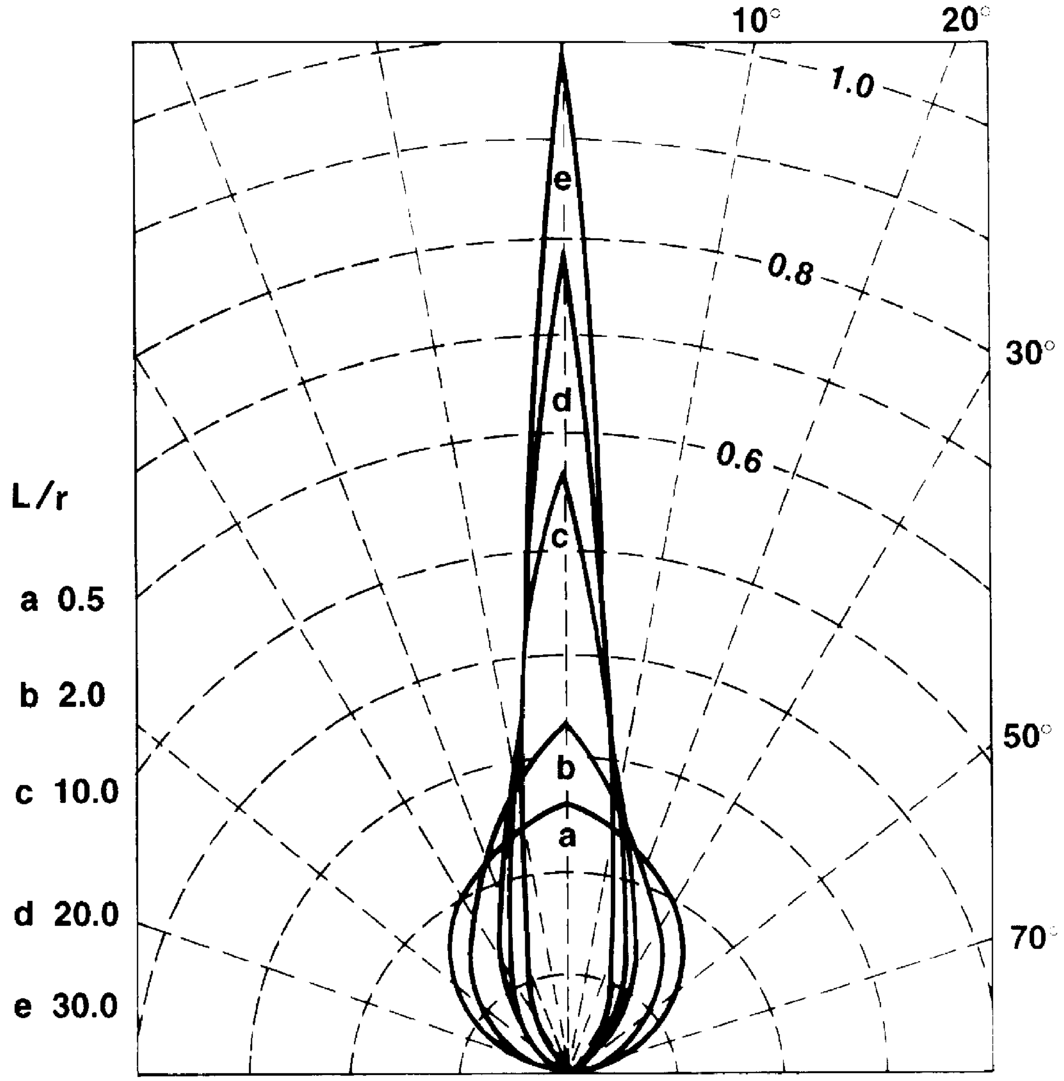
FIG. 8 is a diagrammatic view showing a discharge distribution of an evaporated material depending on a diameter of a nozzle for discharging the evaporated material and a length thereof.
Figure 9A:
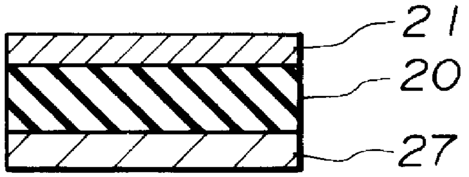
FIGS. 9(*a*) to 9(*f*) each are a schematic view showing each of steps executed in another embodiment of a process for manufacturing a field emission element according to the present invention.
Figure 9B:
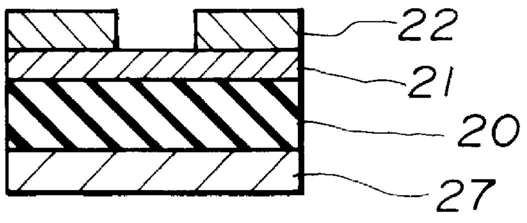
Figure 9C:
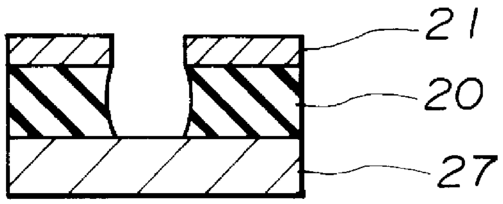
Figure 9D:
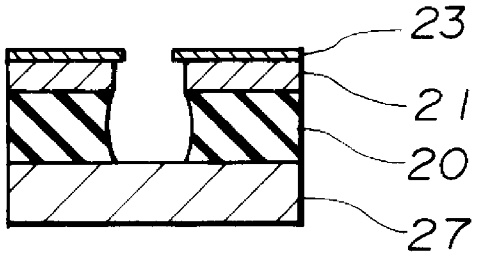
Figure 9E:
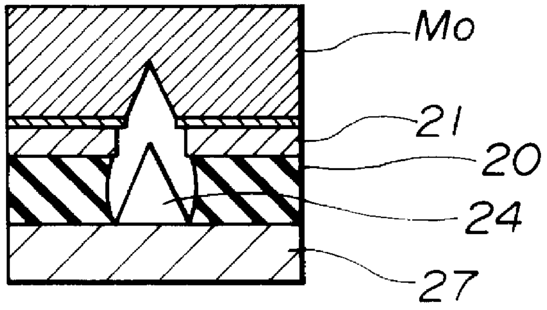
Figure 9F:
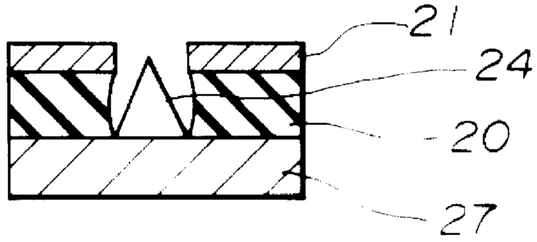

Supposing that a diameter of the nozzles 202 of a cylindrical shape provided at the crucible 200 and a thickness L of the crucible 200 are expressed by r and L, respectively, it is known that an increase in aspect ratio of L/r causes an angle of ejection of the gas from nozzles 202 to exhibit acute directivity as shown in FIG. 8. Therefore, use of such an ICB deposition apparatus for the deposition permits the emitter material to be vertically effectively deposited through the holes 130 shown in FIG. 6(*b*), so that the deposited material may be deposited on the resistive layer 123 as shown in FIG.

6(*b*), resulting in a emitter 115 of a fine conical configuration formed at a tip portion thereof into a pointed shape being provided.

When the nozzles 202 are linearly juxtaposed to each other, it is convenient to arrange a mechanism for carrying out parallel displacement of the laminated substrate 205 or crucibles 200 to permit the deposited material to be uniformly impinged on a whole surface of the laminated substrate 205.

In the illustrated embodiment, the emitter 115 is formed as shown in FIG. 6(*b*) by means of the deposition apparatus and then the emitter material 128 deposited on the gate electrode layer is removed together with the release layer according to any suitable conventional procedure. Then, a second deposition step is executed for depositing metal of a relatively high-melting point such as platinum (Pt), tungsten (W), molybdenum (Mo) or the like on a surface of the emitter 115, particularly, a tip portion of the emitter over a short period of time by electron beam deposition, MBE (molecular beam epitaxy) deposition, low-pressure sputtering or the like, to thereby coat the tip portion of the emitter with a material 115A .

Also, formation of the emitter 115 shown in FIG. 6(*b*) may be carried out in a manner to deposit the emitter tip portion material 115A before the emitter material layer 128 is fully closed, to thereby form the conical emitter or emitter cone, followed by removal of the release layer 127.

The deposition treatments in the second deposition step each are executed in a short period of time, to thereby prevent formation of the emitter from being varied even when use of metal of a high-melting point affects purity of the deposited material and/or causes an angle of irradiation of the deposited material vaporized to be spread.

The illustrated embodiment is directed to the FEC in which the emitter is formed into a conical shape. However, the FEC is not limited to the construction practiced in the illustrated embodiment. It can be applied to manufacturing of an FEC element including an emitter for forming a cold cathode. Also, the crucible of the ICB deposition unit is not restricted to the above-described configuration. For example, a deposition unit constructed so as to discharge the deposited material from a plurality of crucibles through nozzles thereof may be applied to the production of the present invention.

As can be seen from the foregoing, the illustrated embodiment is so constructed that formation of the emitter by deposition is carried out according to the first deposition step in which deposition of metal of a relatively low-melting point is carried out by means of the ICB deposition apparatus, resulting in the deposited material being discharged in a predetermined direction with improved directivity, to thereby form the emitter by deposition. Such construction leads to an improvement in throughput of the vaporized material for deposition to render a configuration of the emitter formed on the laminated substrate uniform and provide the FEC of an increased area in a relatively short period of time.

The second deposition step for forming the emitter is so constructed that metal of a relatively high-melting point and a low work function may be deposited in a reduced thickness on the surface of the emitter. Such construction reinforces the tip portion of the emitter from which electrons are emitted to a degree sufficient to permit a configuration of the tip portion to be kept sharpened, to thereby ensure an electron emission capability of the tip portion. In particular, the illustrated embodiment permits the laminated substrate and evaporation source to be arranged in proximity to each other, to thereby minimize waste consumption of the deposited material which is inherently expensive, resulting in reducing manufacturing costs of the FEC.

Referring now to FIGS. 9(*a*) to 16, a further embodiment of the present invention is illustrated, which is directed to a Spindt-type field emission element and a process for manufacturing the same. First, an R-ICB deposition apparatus (hereinafter also referred to as "R-ICB apparatus") used in the illustrated embodiment will be described with reference to FIG. 10.

The R-ICB apparatus generally designated at reference numeral 31 has a chamber 32 defined therein which is adapted to be evacuated to a high vacuum. The chamber 32 is provided therein with an ICB gun section 33 for converting a deposited material into cluster ions and impinging them on a substrate while accelerating them, to thereby deposit them thereon. The ICB gun section 33 includes a closed crucible 34 made of graphite and a heating unit 35 for heating the crucible 34. The crucible 34 is provided with a nozzle through which the deposited material vaporized in the crucible is ejected to form clusters. The clusters are at least partially ionized by means of electron beams in an ionization section 36 to form ion clusters, which are then vertically impinged on a substrate 37 while being accelerated, resulting in being deposited thereon. The substrate 37 is held on a substrate holder 39 provided with a heater 38. Reference numeral 40 designates a shutter. The chamber 32 has a oxygen gas piping 41 introduced thereinto. The piping 41 is provided at a distal end thereof with an injection port 42 from which oxygen gas is ejected. The oxygen gas is then at least partially ionized in an oxygen gas ionization section 43 and then impinged on the substrate 37 in an oblique direction while being accelerated. Between the ICB gun section 33 and the substrate holder 39 is arranged a frame 44, which functions to increase oxygen partial pressure in proximity to the substrate 37.

Now, formation of an insulating layer which is carried out by means of the apparatus 31 in manufacturing of a field emission element will be described hereinafter.

The apparatus 31 is started, so that the substrate 37 is heated to a film growth temperature by means of the heater 38 and the chamber 32 is evacuated to decrease a pressure of residual gas in the chamber 32 to a level of $5\times10^{-6}$ Torr or less, during which actuation of the ICB gun section is temporarily interrupted to raise the degree of vacuum in the gun section to a level of $2\times10^{-6}$ Torr or less. Then, the ICB gun section 33 is restarted and oxygen of 99.99% in purity is introduced into the gun section to lower the degree of vacuum to a level of $2\times10^{-4}$ Torr, to thereby initiate deposition. The deposition is carried out under conditions that the ionization electron current Ie, ionization electron voltage Ve, ionization acceleration voltage Va and substrate temperature Ts are set to be 300 mA, 500 V, 0 to 3 kV and 200 to 500° C., respectively.

Now, a procedure of formation of the insulating layer in which a film of $Al_2O_3$ is used as the insulating film will be described hereinafter.

Figure 11:
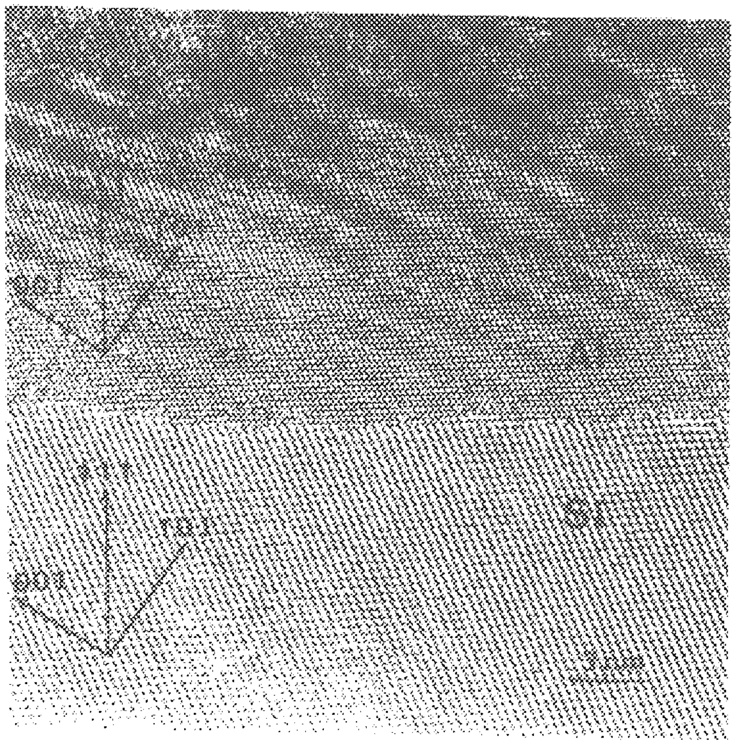
FIG. 11 is a photograph showing a TEM image of an interface of Al (111)/Si (111) formed in an embodiment of the present invention.

A substrate made of Si (111) is previously subject to chemical cleansing and then subject to surface oxidation by means of a sulfuric acid-hydrogen peroxide solution, followed by removal of an oxide film by heating at 850° C. in an ultra-high vacuum, to thereby render a surface of the substrate clean. The ICB source is operated under conditions that the ionization electron current Ie, Ionization electron voltage Ve, ionization acceleration voltage Va and substrate temperature are set to be 100 mA, 150 V, 0 to 5 kV and a room temperature, respectively. This causes an Al film to grow on the Si (111) substrate while keeping crystalline orientation thereof parallel to the substrate. FIG. 11 shows atomic arrangement on an interface of Al (111)/Si (111) formed while keeping the ionization acceleration voltage set at 3 kV. It will be noted that irrespective of the fact that Al has mismatching as large as 25% with respect to Si at the interface, the Al (111) face grows directly from a surface of Si without forming any transition layer for strain release. Also, in general, a degree of formation of solid solution of Si in Al extends to 1.2% at 550° C., however, the film formed by the ICB deposition is free of any grain boundary and has atomic arrangement of good regularity at the interface between the film and the substrate as well. Further, the film exhibits increased thermal stability as compared with the conventional polycrystalline film. The film thus prepared is subject to annealing in turn, to thereby evaluate crystallizability of the film. As a result, the evaluation indicates that the crystallizability of the Al film thus formed by the ICB deposition is somewhat improved with respect to annealing between 250° C. and 500° C. but is hardly varied with respect to annealing at 550° C. Also, formation of any hillock and void on both interface and surface thereof is not observed even after the annealing. The Al film thus deposited is subject to annealing at 400° C. for 8 hours and then taken out to an ambient atmosphere, resulting in being a substrate for growth of $\alpha$-$Al_2O_3$.

Growth of an $\alpha$-$Al_2O_3$ film is carried out by forming Al on the substrate in an oxygen atmosphere by reactive ICB deposition. More particularly, the crucible 34 is charged therein with Al of 99.999% in purity and heated to a temperature of 1500° C. by electron beam impact in the heating unit 35, to thereby form Al vapor. The Al vapor thus formed is ejected from a cylindrical nozzle provided at an upper portion of the crucible 34 and formed into dimensions of 1.3 mm in diameter and 1.3 mm in length, to thereby form clusters, which are then ionized by means of electron beams emitted from a filament in the ionization section 36, to thereby form ionized clusters. The ionized clusters are accelerated toward the substrate 37, resulting in being deposited thereon. A distance between the crucible 34 and the substrate 37 is set to be 150 nm. Oxygen is introduced into a region in the chamber 32 in proximity to the substrate 37 through a variable leak valve. The growth is carried out in a manner to evacuate the chamber 32 to a level of about $1\times10^{-6}$ Torr and interrupt operation of the ICB gun section 33 to recover the degree of vacuum in the chamber. Then, the Al/Si substrate is heated at 500° C. for 2 minutes to remove any impurity adsorbed on a surface of the substrate. Subsequently, the ICB gun section 33 is restarted and oxygen of 99.9% in purity is introduced into the chamber to lower the degree of vacuum to a level of $2\times10^{-4}$ Torr, followed by setting a temperature of the substrate at a film growth temperature, resulting in the deposition being initiated. The ionization electron current Ie, ionization electron voltage Ve and ionization acceleration voltage Va are set to be 400 mA, 400 V and 0 to 5 kV, respectively.

Figure 12A:
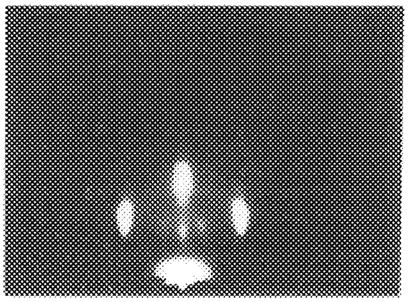
FIGS. 12(*a*) to 12(*c*) each are a view showing a RHEED pattern of an $\alpha$-$Al_2O_3$ of a hetero-epitaxial growth obtained in an embodiment of the present invention.
Figure 12B:
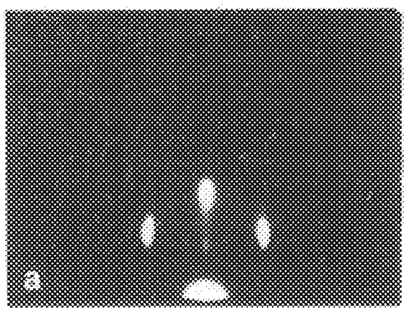
Figure 12C:
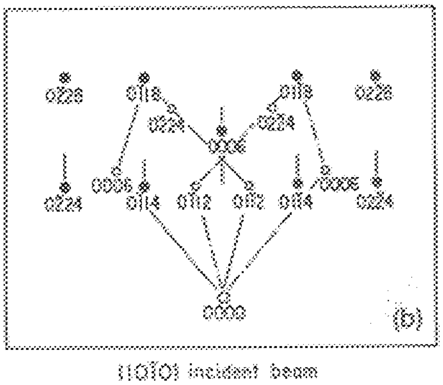

FIGS. 12(*a*) to 12(*c*) each show electron beam diffraction of the $\alpha$-$Al_2O_3$ film formed by hetero-epitaxial growth which in obtained using electron beams at 75 keV, wherein FIG. 12(*a*) shows a pattern of $\alpha$-$Al_2O_3$ formed on a sapphire substrate, FIG. 12(*b*) shows a pattern of $\alpha$-$Al_2O_3$ formed on an Al (111) monocrystalline film formed on a Si substrate, and FIG. 12(*c*) shows an index of each of the films. These RHEED patterns each have a distinct streak pattern appearing thereon, thus, it will be noted that it has a flat surface and exhibits satisfactory crystallizability. Epitaxial relationships between the growth films obtained and the substrate are as follows:

$\alpha$-$Al_2O_3$ (0001)//Al (111)//Si (111)

$\alpha$-$Al_2O_3$ (0227)//Al (111)//Si (111)

Figure 13:
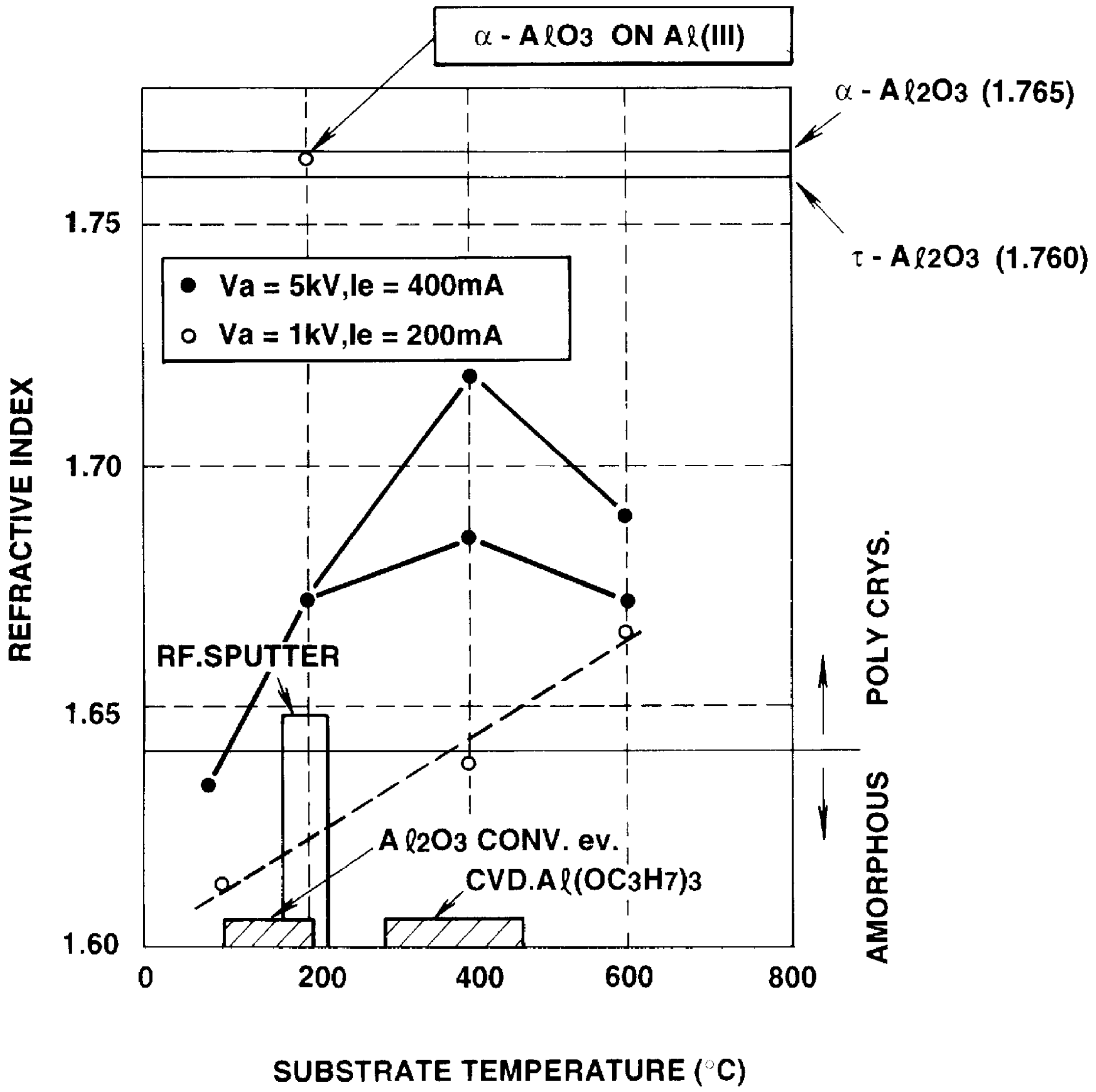
FIG. 13 is a graphical representation showing a film of $Al_2O_3$ prepared under various conditions in an embodiment of the present invention and a temperature for growth.

When the substrate temperature is considered to be a factor for the growth, the substrate temperature of 200° C. provides the film with best crystallizability on an Al (111) face. It will be noted that irrespective of the fact that lattice mismatching as large as 18.6% at a hetero-interface of $\alpha$-$Al_2O_3$ (0001)//Al (111), the substrate temperature of 200° C. permits the epitaxial growth to be effectively carried out. It is known that a refractive index of $Al_2O_3$ is varied depending on a crystalline structure thereof. FIG. 13 shows relationships between a refractive index of a film deposited under conditions of Va=1 kV and Ie=100 mA and the substrate temperature and those between a refractive index of a film deposited under conditions of Va=5 kV and Ie=200 mA. The measurement was carried out by means of an automatic ellipsometer using a He-Ne laser of 633.8 nm in wavelength. A refractive index of the film increases with an increase in each of the ion acceleration voltage and ionization electron current and also tends to increase with an increase in substrate temperature. The ion acceleration voltage of 5 kV permits the film to exhibit a maximum refractive index at the substrate temperature of 400° C., resulting in crystallizability of the film being enhanced. The refractive index is 1.763, which highly approximates to 1.765 which is a refractive index of monocrystalline $\alpha$-$Al_2O_3$.

Figure 10:
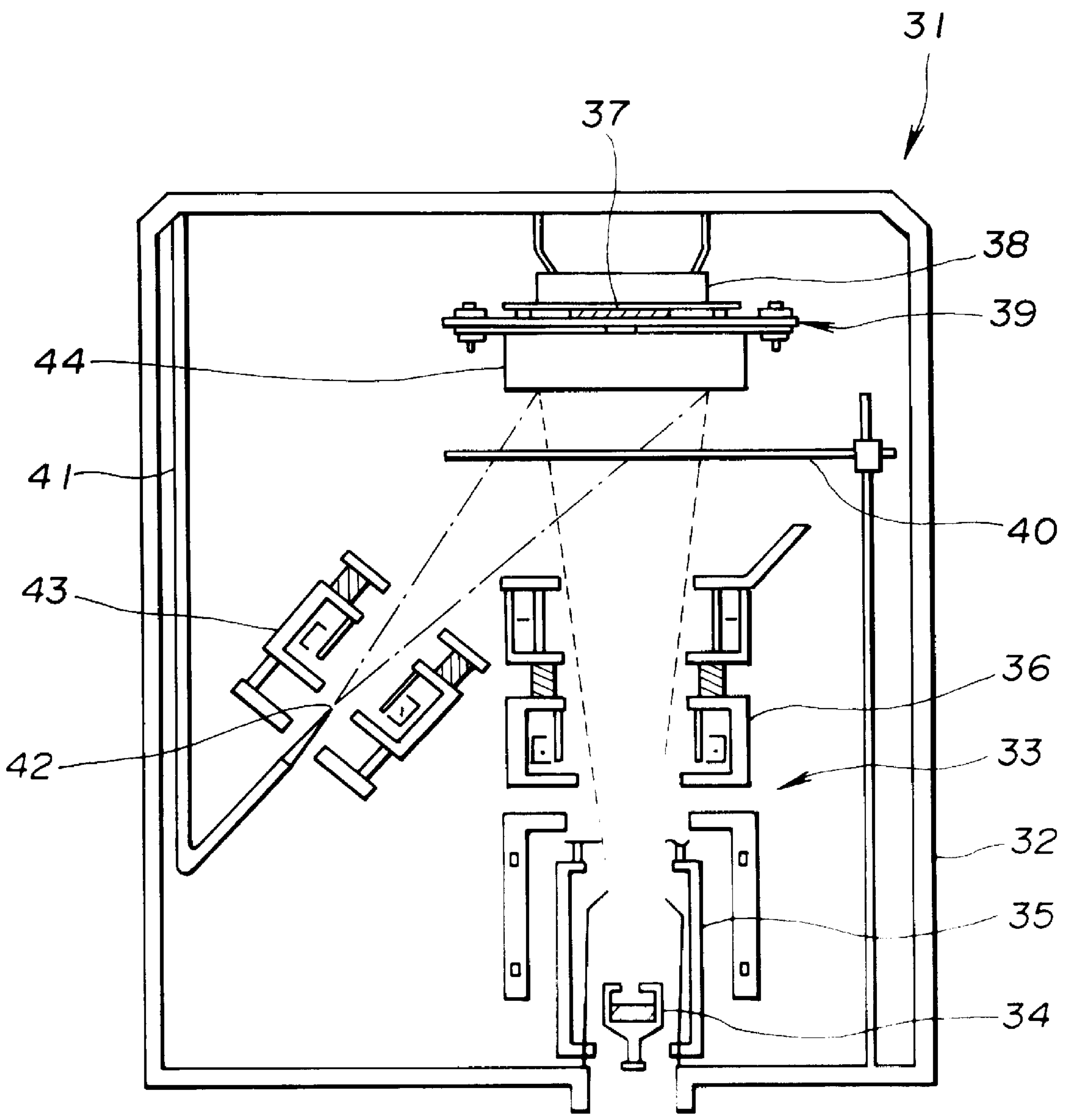
FIG. 10 is a sectional view showing an example of an R-ICB deposition apparatus suitable for use in an embodiment of the present invention.
Figure 14:
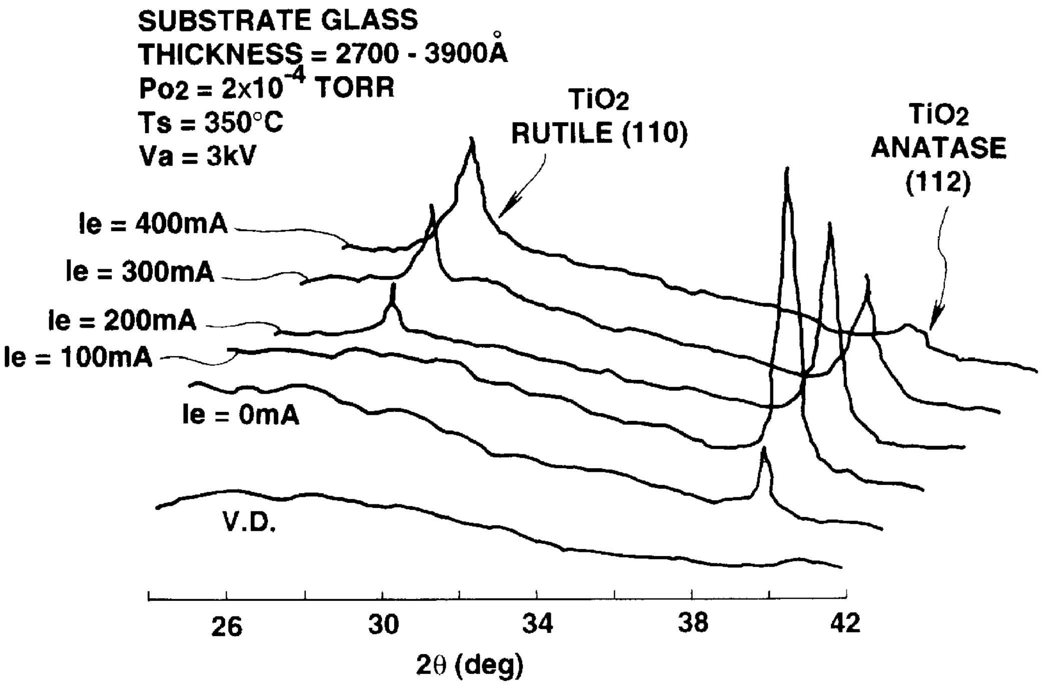
FIG. 14 is an X-ray diffraction pattern showing a $TiO_2$ film obtained in an embodiment of the present invention while keeping an oxygen partial pressure constant at $2\times10_{-4}$ Torr and ionization electron current set at 0 to 400 mA.
Figure 15:
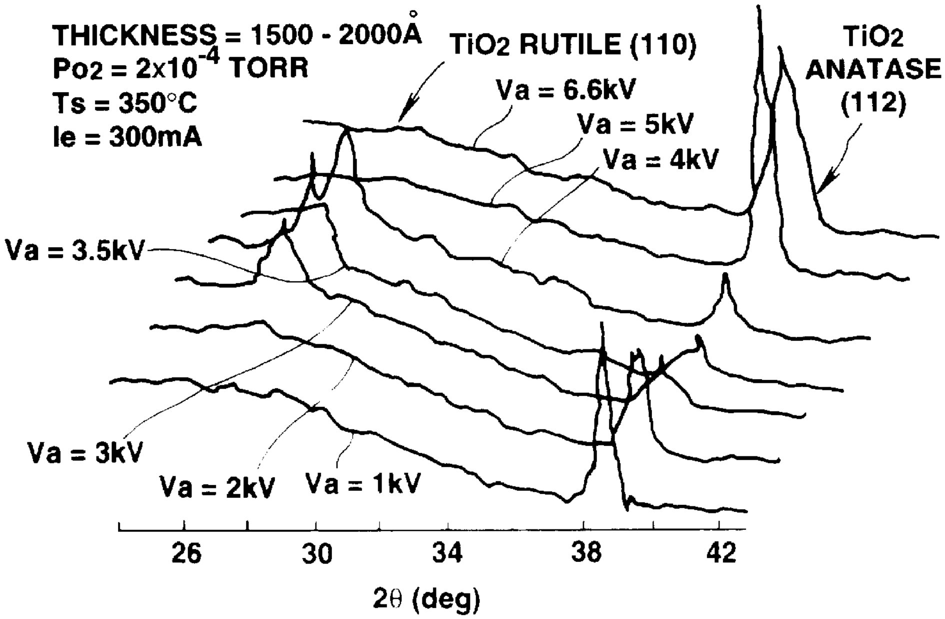
FIG. 15 is an X-ray diffraction pattern showing a $TiO_2$ film obtained in an embodiment of the present invention while keeping an ionization electron current Ie set at 300 mA and an ionization acceleration voltage set at 1 to 6.6 kV.

Now, use of a $TiO_2$ film as the insulating layer will be described. For this purpose, the R-ICB apparatus 31 shown in FIG. 10 is used. Ti of 99.9% in purity is charged in the crucible 34 under an oxygen atmosphere and heated to 2000° C. by electron beam impact, to thereby form clusters. An oxygen gas pressure is introduced into a region in proximity to the substrate 37 through a variable leak valve and kept at $2.0\times10^{-4}$ Torr. The Ti clusters and oxygen gas are partially ionized by electron beams discharged from the filament in the ionization section 36. A ratio of the ionization may be adjusted by varying the ionization electron beam. The preparation is carried out under conditions that the substrate temperature Ts, ionization voltage Ve, ionization electron current Te and ionization acceleration voltage Va are set to be 50° C., 500 V, 0 to 400 mA and 0 to 6.6 kV, respectively. FIG. 14 shows an X-ray diffraction pattern obtained when an oxygen partial pressure is constantly kept at $2\times10^{-4}$ Torr and the ionization electron current Te is varied between 0 mA and 400 mA. When the current Ie is within a range of 0 to 100 mA, a peak of a $TiO_2$ (112) face of an anatase-type structure is observed; whereas the peak of the anatase-type $TiO_2$ (112) face is decreased with an increase in ionization electron current Te to 200 to 400 mA and instead a peak of a rutile-type $TiO_2$ (110) structure appears, of which the intensity is increased with an increase in ionization electron current. FIG. 15 shows an X-ray diffraction pattern obtained when the ionization electron current Te is kept at 300 mA and the ionization acceleration voltage Va is varied between 1 kV and 6.6 kV. $TiO_2$ is subject to a phase change of from the anatase-type structure to the rutile-type structure with an increase in ionization acceleration voltage. A further increase in ionization acceleration voltage causes it to be changed from the rutile-type structure to the anatase-type structure.

Figure 16:
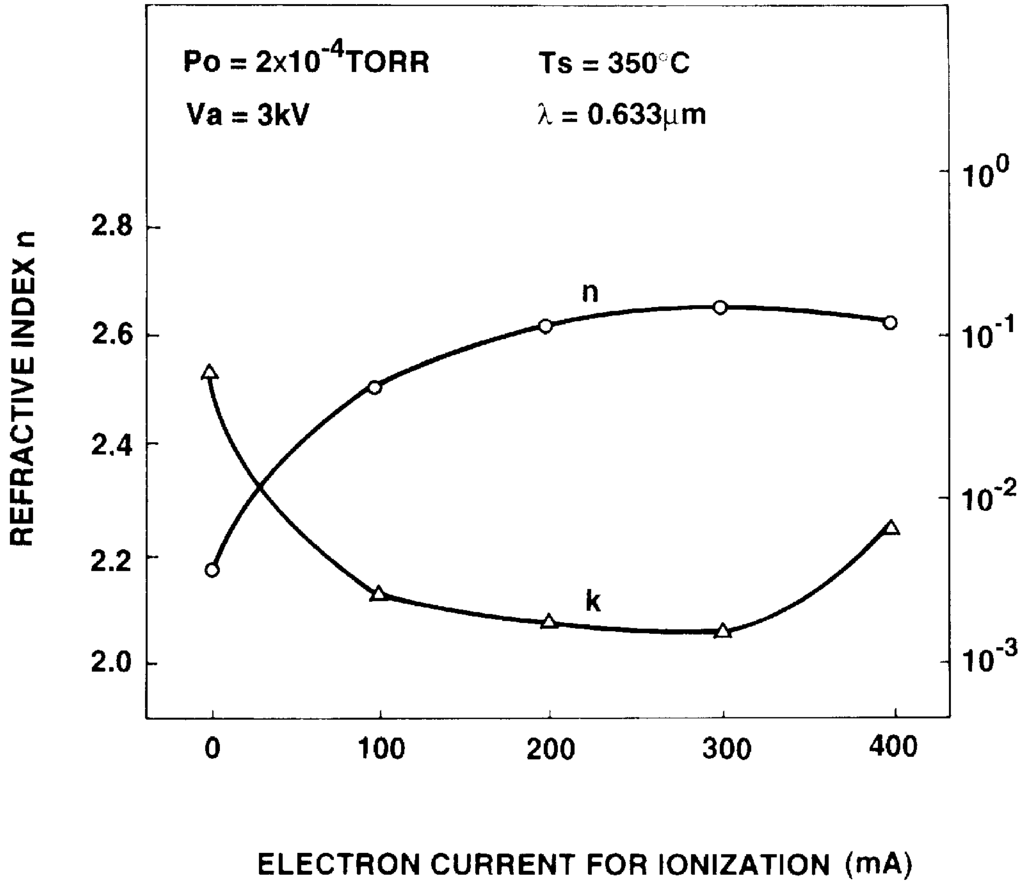
FIG. 16 is a graphical representation showing a relationship between an ionization electron beam Ie set at 0 to 400 mA and a refractive index n of a $TiO_2$ film in an embodiment of the present invention.
Figure 17:
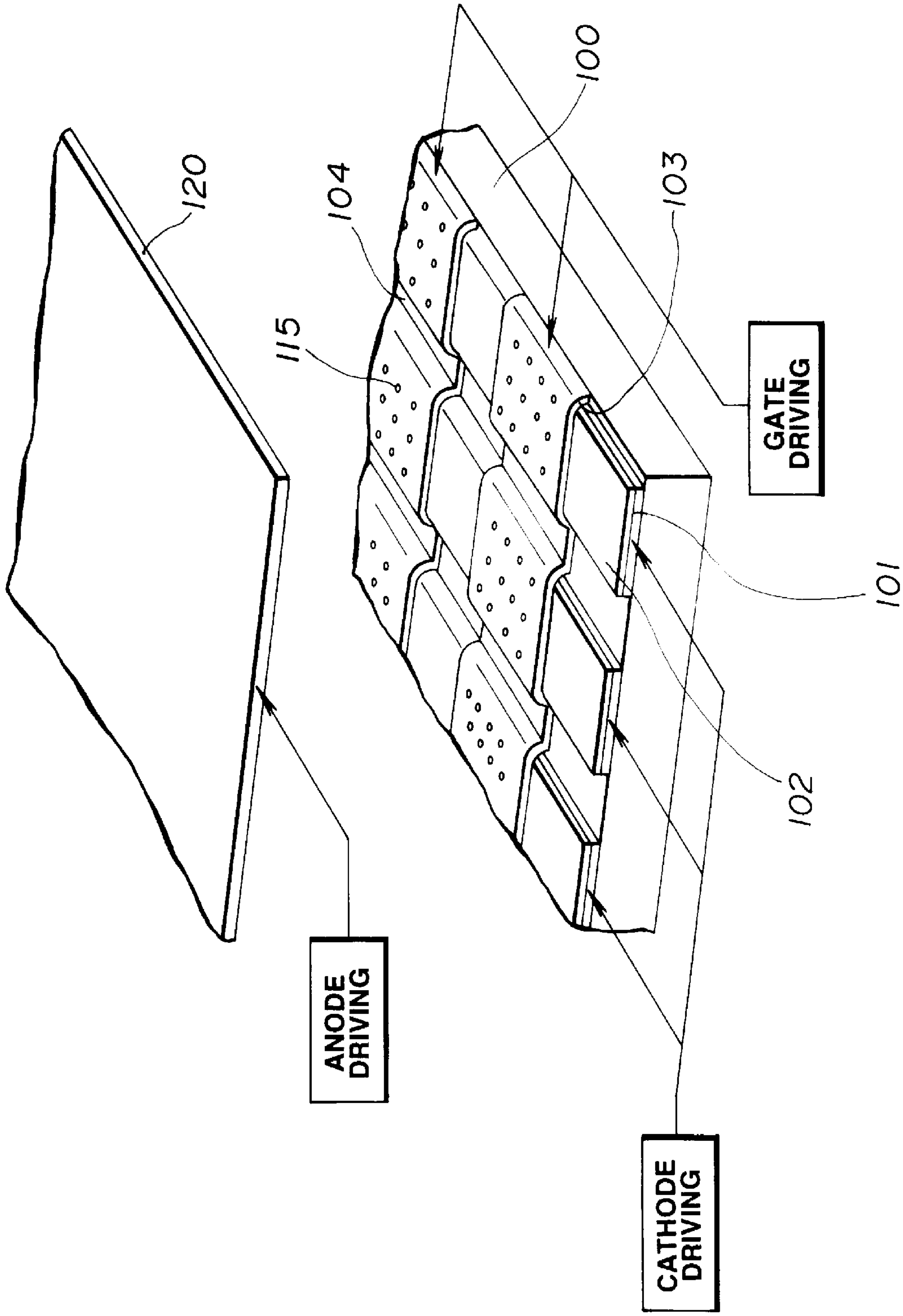
FIG.17 PRIOR ART
FIG. 17 is a perspective view showing a device constructed of a field emission cathode.
Figure 18A:
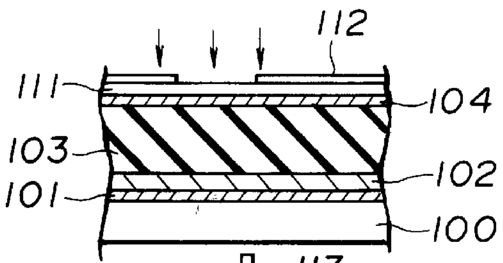
FIG.18(a) PRIOR ART
FIGS. 18(*a*) and 18(*f*) each are a schematic view showing each of steps for manufacturing a field emission element.
Figure 18B:
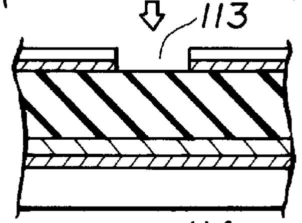
FIG.18(b) PRIOR ART
Figure 18C:
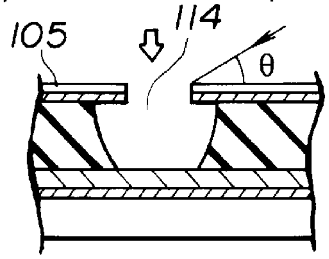
FIG.18(c) PRIOR ART
Figure 18D:
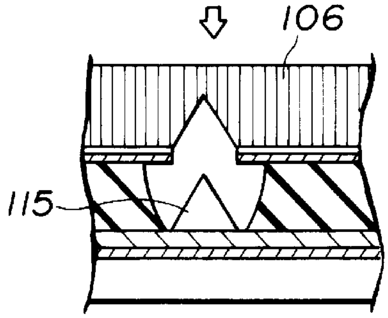
FIG.18(d) PRIOR ART
Figure 18E:
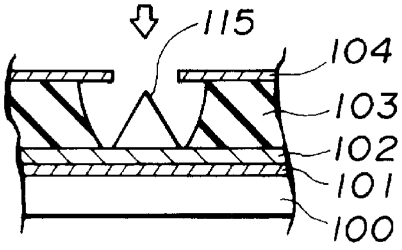
FIG.18(e) PRIOR ART
Figure 18F:
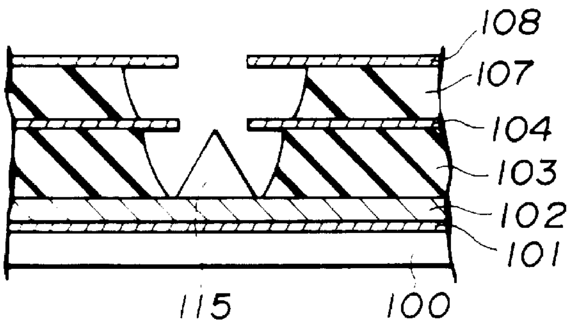
FIG.18(f) PRIOR ART
Figure 19:
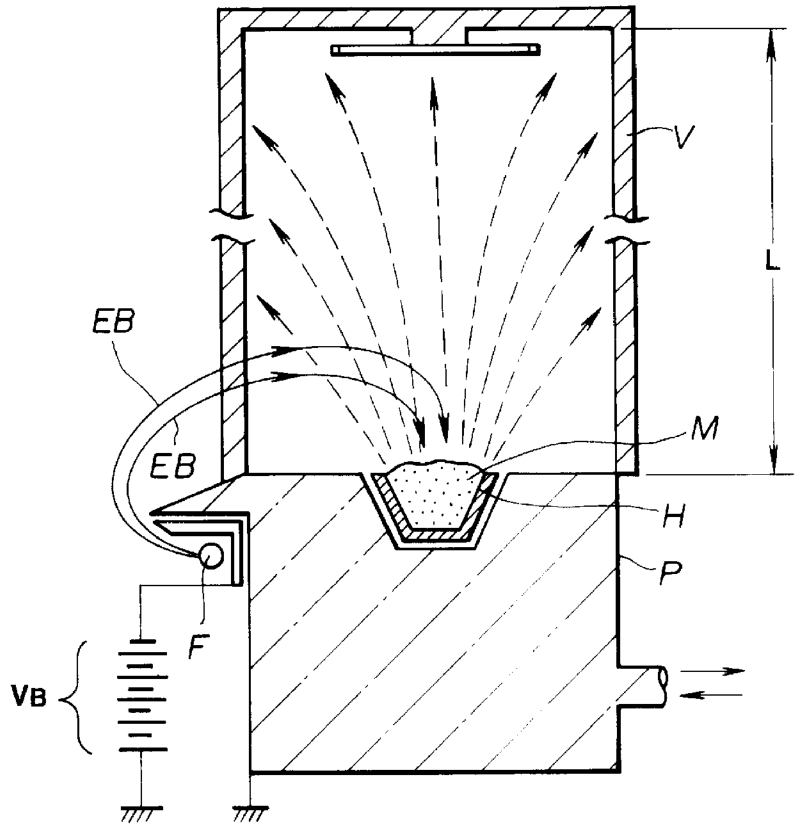
FIG.19 PRIOR ART
FIG. 19 is a schematic view showing a principle of an ICB deposition apparatus.
Figure 20:
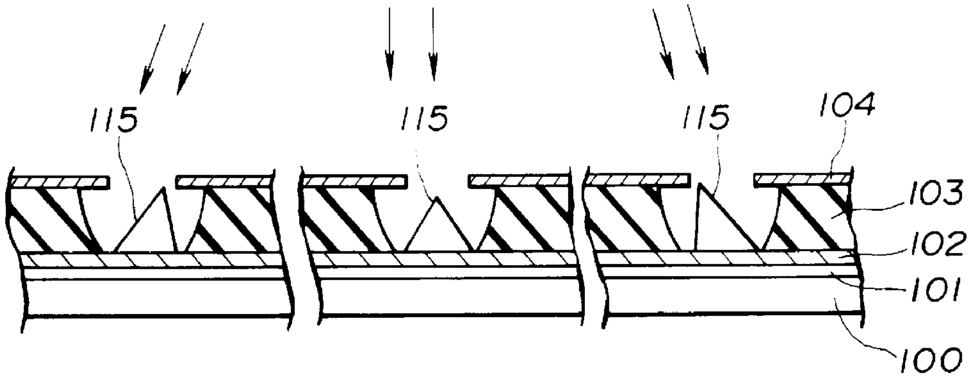
FIG.20 PRIOR ART
FIG. 20 is a sectional view showing a conventional emitter.

It is known in the art that a refractive index n of $TiO_2$ is varied depending on a crystalline structure thereof. FIG. 16 shows a variation in refractive index of $TiO_2$ when the ionization electron current Ie is varied within a range of 0 to 400 mA. It will be noted that the refractive index is increased from 2.2 to 2.6 with an increase in ionization electron current. Also, FIG. 16 indicates that an absorbancy index of the film is reduced, with an increase in ionization electron current, to a value approximating to 2.7 which is an absorbancy index of the rutile-type monocrystalline structure.

The above description has been made on the insulating layer formed of either $\alpha$-$Al_2O_3$ or $TiO_2$. However, the insulating layer may be formed of a material selected from the group consisting of BeO, $BeO_2$, $ThO_2$, MgO, $ZrO_2$ and compounds thereof by multi-deposition techniques using cluster ions. Also, MBE deposition permits the epitaxial growth on the substrate, resulting in likewise providing the insulating layer.

Now, manufacturing of a field emission element using the thus-formed insulating layer will be described hereinafter with reference to FIG. 9.

The insulating layer 20 thus provided on the substrate 27 is formed thereon with a gate layer 21 of a Nb film having a thickness of 0.4 $\mu$m and then a diameter of each of holes of the gate is subject to patterning by a resist 22, followed by reactive ion etching (RIE) of the gate layer 21 using $SF_6$. Then, the insulating layer 20 is subject to etching, to thereby form a hole. The etching is carried out using a 20% sodium hydroxide solution or 340 g of a mixed solution of 2 parts by volume of 42 Baume ferric chloride solution and one part by volume of 38% concentrated hydrochloric acid, when the insulating layer 20 is formed of $Al_2O_3$; whereas it is carried out using concentrated sulfuric acid when the layer 20 is made of $TiO_2$. Subsequently, an Al release layer 23 is obliquely deposited on the gate layer 21 while being prevented from being deposited in the gate hole and then Mo is vertically deposited on the substrate. This leads to formation of an emitter 24 of a conical shape. Finally, removal of the Al release layer 23 is carried out to complete the field emission element.

The illustrated embodiment is effectively applied to manufacturing of an emitter for a flat type field emission element in addition to the Spindt-type field emission emitter described above.

Thus, the illustrated embodiment permits the insulating layer for the field emission element to be formed of a monocrystal or a polycrystal preferentially oriented in at least a direction perpendicular to the substrate, so that the insulating layer may exhibit uniform insulating strength over an increased area thereof and prevent gas adsorption by grain boundaries, resulting in emission of electrons being stabilized. Also, the illustrated embodiment substantially prevents deterioration of the insulating layer due to an emission current and deterioration of insulating characteristics due to a process temperature. Thus, the illustrated embodiment realizes an improvement in characteristics of the field emission element due to refining of the element.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A field emission element comprising:

a substrate;

an insulating layer disposed on said substrate and having a plurality of apertures therethrough;

a gate electrode layer disposed on said insulating layer;

wherein said insulating layer is formed of a material different from said substrate into a monocrystalline structure or polycrystalline structure preferentially oriented in at least a direction perpendicular to said substrate.

2. A field emission element as defined in claim 1, wherein said insulating layer is made of a material selected from the group consisting of metals oxides of Al, Ti, Be, Ca, Th, Mg, Zn and Zr and compounds of at least one of said metals.

3. A field emission element comprising:

a substrate;

an insulating layer disposed on said substrate and having a plurality of apertures therethrough;

an emitter disposed in each of the plurality of apertures and disposed on said substrate; and a gate electrode layer disposed on said insulating layer;

wherein said emitter is formed of metal or semiconductor different from a material of said substrate into a monocrystalline structure and arranged in a specified crystal orientation in at least a direction perpendicular to said substrate.

4. A field emission element comprising:

a substrate;

an insulating layer disposed on said substrate and having a plurality of apertures therethrough;

an emitter disposed in each of the plurality of apertures and disposed on said substrate; and a gate electrode layer disposed on said insulating layer;

wherein said emitter is formed of metal or semiconductor different from a material of said substrate into a polycrystalline structure preferentially oriented in at least a direction perpendicular to said substrate.

5. A field emission element comprising:

a substrate;

an insulating layer disposed on said substrate and having a plurality of apertures therethrough;

an emitter disposed in each of the plurality of apertures and disposed on said substrate, said emitter including bottom and tip portions, said bottom portion being arranged contiguous to said substrate and made of materials different from said tip portion, said tip portion being formed of metal or semiconductor into a monocrystalline structure or a polycrystalline structure preferentially oriented in at least a direction perpendicular to said substrate; and a gate electrode layer disposed on said insulating layer.

* * * * *